(12) United States Patent
Lee et al.

(10) Patent No.: US 10,973,120 B1
(45) Date of Patent: Apr. 6, 2021

(54) INSULATING FILM AND PRINTED CIRCUIT BOARD INCLUDING THE SAME

(71) Applicant: SAMSUNG ELECTRO-MECHANICS CO., LTD., Suwon-si (KR)

(72) Inventors: Junghyun Lee, Suwon-si (KR); Changhyun Yoon, Suwon-si (KR); Seong-Chan Park, Suwon-si (KR); Choonkeun Lee, Suwon-si (KR); Youngju Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/831,287

(22) Filed: Mar. 26, 2020

(30) Foreign Application Priority Data

Jan. 29, 2020 (KR) .................. 10-2020-0010203

(51) Int. Cl.
*H05K 1/03* (2006.01)
*B32B 15/20* (2006.01)

(52) U.S. Cl.
CPC .......... *H05K 1/0353* (2013.01); *B32B 15/20* (2013.01); *B32B 2457/08* (2013.01); *H05K 2201/0141* (2013.01); *H05K 2201/0179* (2013.01)

(58) Field of Classification Search
CPC ...... H05K 1/03; H05K 1/0326; H05K 1/0346; H05K 1/0353; H05K 2201/0141; H05K 2201/10136; H05K 2201/0179; B32B 15/20; B32B 2457/08
See application file for complete search history.

(56) References Cited

U.S. PATENT DOCUMENTS

| | | | |
|---|---|---|---|
| 2009/0068452 A1* | 3/2009 | Sato | B32B 38/004 428/336 |
| 2009/0081432 A1* | 3/2009 | Gomi | B32B 7/10 428/214 |
| 2010/0323193 A1* | 12/2010 | Matsuo | B29C 65/1435 428/336 |
| 2014/0023881 A1* | 1/2014 | Sakaguchi | B32B 15/08 428/621 |

FOREIGN PATENT DOCUMENTS

| | | |
|---|---|---|
| EP | 2 682 264 A1 | 1/2014 |
| JP | 2007-70418 A | 3/2007 |
| KR | 10-2013-0126997 A | 11/2013 |

OTHER PUBLICATIONS

Meisheng Zhou et al., "The effect of pretreatment on adhesive strength of Cu-plated liquid crystal polymer (LCP)", Applied Surface Science 258 (2012), pp. 2643-2647.

Takeharu Sugiyama et al., "Surface Metallization on High Temperature Liquid-Crystal-Polymer Film by UV-Irradiation Process", Journal of the Electrochemical Society, 156 (9) (2009), pp. D360-D363.

* cited by examiner

*Primary Examiner* — Hoa C Nguyen
(74) *Attorney, Agent, or Firm* — Morgan, Lewis & Bockius LLP

(57) ABSTRACT

An insulating film includes an insulating layer and a surface bonding layer disposed on the insulating layer. The surface bonding layer includes a radical generation element and a coordinate bond element. In the surface bonding layer, a/b is 0.05 or more and 0.35 or less, in which 'a' is an atom content of the coordinate bond element and 'b' is an atom content of the radical generation element.

19 Claims, 4 Drawing Sheets

(a)

(b)

(c)

INSULATING FILM AND PRINTED CIRCUIT BOARD INCLUDING THE SAME

CROSS-REFERENCE TO RELATED APPLICATION(S)

This application claims the benefit under 35 USC 119(a) of Korean Patent Application No. 10-2020-0010203 filed on Jan. 29, 2020 in the Korean Intellectual Property Office, the entire disclosure of which is incorporated herein by reference for all purposes.

TECHNICAL FIELD

The present disclosure relates to an insulating film and a printed circuit board including the same.

BACKGROUND

Description of Related Art

Due to the recent development of 5G wireless communications technology or the like, an insulating material having a low dielectric constant (Dk) and a low dissipation factor (Df) has been required to be introduced to a printed circuit board as an insulating material to significantly reduce electrical signal loss in a radio-frequency region such as an antenna, an antenna module, or the like.

In particular, a liquid crystal polymer (LCP) has a low dissipation factor, and may transmit and receive data at high speed and have characteristics such as low moisture absorption and improved durability and reliability. Therefore, a liquid crystal polymer has been in the spotlight as an insulating material in a radio-frequency region. However, a liquid crystal polymer suffers from low bonding force caused by characteristics such as high hydrophobicity and low surface roughness. Accordingly, various technologies for improving bonding force between a fine wiring pattern and a liquid crystal polymer are under development.

In a certain case, bonding force between an insulating layer and a metal layer may be improved by a mechanical method in which the insulating layer is subjected to a surface treatment to provide surface roughness. However, the surface roughness causes radio-frequency signal loss to be increased.

SUMMARY

An aspect of the present disclosure is to provide an insulating film, having improved bonding force to a metal layer and capable of significantly reducing radio-frequency signal loss without a significant increase in surface roughness, and a printed circuit board including the insulating film.

According to an aspect of the present disclosure, an insulating film includes an insulating layer and a surface bonding layer disposed on the insulating layer. The surface bonding layer includes a radical generation element and a coordinate bond element. In the surface bonding layer, a/b is 0.05 or more and 0.35 or less, in which 'a' is an atom content of the coordinate bond element and 'b' is an atom content of the radical generation element.

According to an aspect of the present disclosure, a printed circuit board includes an insulating film including an insulating layer and a surface bonding layer disposed on the insulating layer, and a metal layer disposed on the surface bonding layer. The surface bonding layer includes a radical generation element and a coordinate bond element. In the surface bonding layer, a/b is 0.05 or more and 0.35 or less, in which 'a' is an atom content of the coordinate bond element and 'b' is an atom content of the radical generation element.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, embodiments of the present disclosure will be described as follows with reference to the attached drawings.

Figure 1:
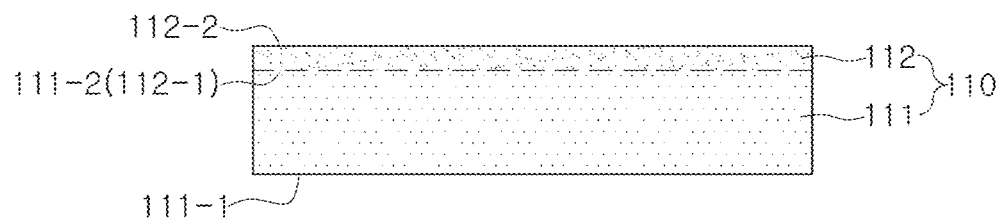
FIG. 1 is a cross-sectional view of an insulating film according to an example embodiment of the present disclosure.

FIG. 1 is a cross-sectional view of an insulating film according to an example embodiment.

Referring to FIG. 1, an insulating film 110 according to an example embodiment includes an insulating layer 111 and a surface bonding layer 112 provided on the insulating layer 111. The insulating layer 111 has a first surface 111-1 and a second surface 111-2, and the surface bonding layer 112 has a first surface 112-1, facing the second surface 111-2, and a second surface 112-2 opposing the first surface 112-1. The second surface 111-2 of the insulating layer 111 may match the first surface 112-1 of the surface bonding layer 112. A boundary between the insulating layer 111 and the surface bonding layer 112 may not be visually apparent.

A material for forming the insulating layer 111 may be, in detail, an insulating material, capable of significantly reducing electrical signal loss in a radio-frequency region. In this regard, in detail, an insulating material having a low dielectric constant (Dk) and/or a low dissipation factor (Df) may be used. For example, a liquid crystal polymer (LCP) may be used as a material for forming the insulating layer 111. However, a material for forming the insulating layer 111 is not limited thereto, and a non-limiting example thereof may be polyimide (PI), modified PI, polyarylene ether (PAE), parylene, polyethylene (PE), polyphenylene ether (PPE), or the like.

In FIG. 1, the surface bonding layer 112 is illustrated as being formed only on the second surface 111-2 surface of the insulating layer 111. However, the surface bonding layer 112 may be formed on opposite surfaces of the insulating layer 111. In addition, a metal foil such as copper foil, not illustrated, may be attached to the first surface 111-1, a surface opposing the second surface 111-2 on which the surface bonding layer 112 of the insulating layer 111 is formed.

The surface bonding layer 112 may serve to bond the first surface 112-1 to the insulating layer 111 and to bond the second surface 112-2 to the metal layer, and may improve bonding force between the insulating film 110 and a metal layer disposed on the insulating film 110. For example, as will be described later, a radical generating element A and a linker may form a covalent bond at a side of the first surface 112-1 of the surface bonding layer 112, and a coordinate bond element of the linker and a metal element may form a coordination bond on a side of the second surface 112-2 of the surface bonding layer 112.

Figure 2:
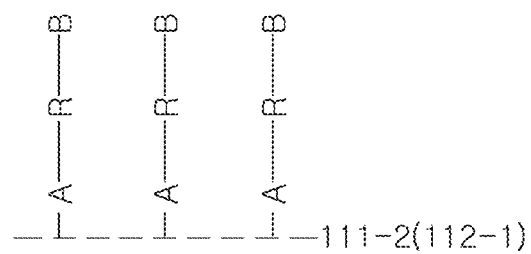
FIG. 2 is a bonding structure between some elements on a surface of an insulating film according to an example embodiment of the present disclosure.

FIG. 2 is a bonding structure between some elements on a surface of an insulating film according to an example embodiment.

Figure 3:
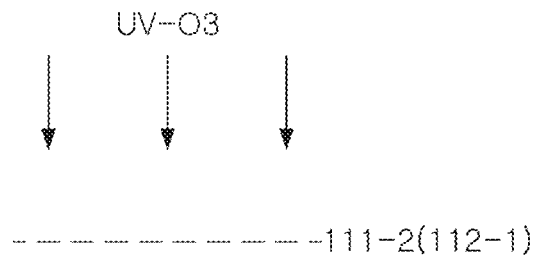
FIG. 3 is a schematic diagram illustrating a portion of a process of forming an insulating film according to an example embodiment of the present disclosure.
Figure 3:
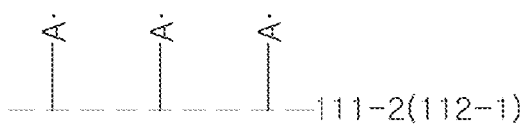
Figure 3:
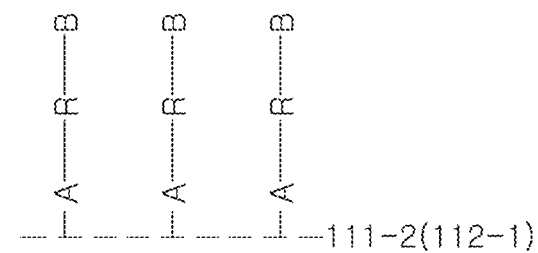

FIG. 3 is a schematic diagram illustrating a portion of a process of forming an insulating film according to an example embodiment.

Hereinafter, a process of forming the surface bonding layer 112 on the insulating layer 111 will be described with reference to FIG. 3.

A description will be given based on the second surface 111-2 of the insulating layer 111 on the drawings, but the same process may be applied to the first surface 111-1.

Referring to (a) and (b) in FIG. 3, a UV—$O_3$ treatment is performed on the second surface 111-2 of the insulating layer 111. When the UV-$O_3$ treatment is performed on a surface of the insulating layer 111, radicals A. may be formed on the surface subjected to the UV-$O_3$ treatment. In addition, surface cleaning and hydrophilicity of the insulating layer 111 may be improved.

As the radicals A. are formed on the surface of the insulating layer 111, the radicals A. may form a covalent bond with a portion of elements included in the bonding material, as described later. Thus, the surface bonding layer 112 may include a radical generating element A. The radical generating element 'A' refers to an element which may generate the radicals A. but has a stable state in which there are no noncovalent electron pairs.

For example, oxygen radicals O. may be formed on the surface of the insulating layer 111 by decomposition and/or reaction of oxygen ($O_2$) and/or water vapor ($H_2O$) in the atmosphere through the UV-$O_3$ treatment. Therefore, as described below, the surface bonding layer 112 may include an oxygen element O as the oxygen radicals O forms a covalent bond with a portion of elements included in the bonding material. In this case, at least one of a hydroxyl radical OH., a hydrogen radical H., and a hydroxyl group (—OH), other than the oxygen radical O., may be further formed on the surface of the insulating layer 111.

However, the radical generating element A is not limited to the oxygen element O, and type of radicals A. formed on the surface of the insulating layer 111 may vary depending on a specific execution environment. For example, sulfur radicals S. and/or sulfuric acid radicals $SO_4$.— may be formed on the surface of the insulating layer 111 depending on UV-$O_3$ treatment conditions. In this case, the surface bonding layer 112 may include sulfur (S) as a sulfur radical S. and/or a sulfuric acid radical $SO_4$.— forms a covalent bond with a portion of the elements included in the bonding material.

In general, a UV—$O_3$ treatment is performed on the surface of the insulating layer such that a surface roughness of the insulating layer is increased to improve the bonding strength to a metal. However, in this application, a UV—$O_3$ treatment is performed to form radicals A. on a surface of an insulating layer rather than to increase a surface roughness.

In this case, the UV-$O_3$ treatment may be performed on the surface of the insulating layer 111 for about one minute to about seven minutes.

When UV-$O_3$ treatment time is insufficient, the radicals A. are not sufficiently formed on the surface of the insulating layer 111. Accordingly, since there is a limitation in the amount of a linker capable of bonding to the radical A., bonding force to a metal may not be significantly improved. Meanwhile, when the UV-$O_3$ treatment time is excessive, the surface of the insulating layer 111 may be overoxidized to reduce the bonding force to the metal.

In this case, in detail, intensity of light may be adjusted to prevent a blister from being formed on the surface of the insulating layer 111.

Referring to (c) in FIG. 3, a linker is introduced to the surface of the insulating layer 111 to form a surface bonding layer 112 on the surface of the insulating layer 111, and thus, a covalent bond is formed between the insulating layer 111 and the linker. The linker may be introduced by dipping the insulating layer 111 in a linker-containing solution, but introduction of the linker is not limited thereto. For example, a method of spraying a linker-containing solution on the surface of the insulating layer 111 may be used.

The linker may include a linking group R linking the radical generating element A with a coordinate bond element B to be described later.

The linking group R may include a substituted alkyl group, an unsubstituted alkyl group, a substituted aryl group and/or an unsubstituted aryl group. In addition, the linking group R may further include heteroatoms. For example, the linking group R may include nitrogen (N).

Carbon number of the alkyl group is not necessarily limited, but may include about one to ten carbon atoms. Alternatively, the carbon number of the alkyl group may include about one to five carbon atoms. For example, the alkyl group may be one of methyl, ethyl, n-propyl, iso-propyl, n-butyl, sec-butyl, iso-butyl, tert-butyl, n-pentyl, tert-pentyl, neo-pentyl, iso-pentyl, and sec-pentyl.

The aryl group includes phenyl, benzyl, naphthyl, or alkyl substituted versions thereof, for example, tolyl, xylyl, and mesityl.

At least a portion of the elements included in the linker may form a covalent bond with the radical A. formed on the surface of the insulating layer 111. In this regard, the linker may include one or more of an alkene compound, a thiol compound, and a disulfide compound, materials each having a double bond. Alternatively, the linker may include one or more of a compound having a hydroxyl group (—OH group) and a compound having a carboxyl group (—COOH). Accordingly, the surface bonding layer 111 may include one or more of elements, such as carbon, hydrogen, oxygen, and sulfur, by introduction of a linker.

In addition, the linker may include a coordinate bond element B, capable of coordinating with metal ions. The coordinate bond element refers to an element, capable of providing electrons to a coordinated metal ion. For example, the coordinate bond element B includes at least one of nitrogen (N), fluorine (F), chlorine (Cl), carbon (C), and oxygen (O), which may have a noncovalent electron pair in an ionic state.

In this regard, the linker may include one of allylamine, vinyl imidazole, and acrylamide. In this case, the coordinate bond element B may include nitrogen. However, type of linker is not limited to the above-mentioned materials.

The element, forming a covalent bond to the radical A., may be included in an end portion of the linking group R. The coordinate bond element B may be included in the terminal portion of the linker and may be an element disposed on an opposing side of the element forming a covalent bond to the radical A..

When a metal ion and/or an oxidizer is introduced, a radical A. required for a covalent bond on the surface of the insulating layer 111 may be sufficiently formed.

For example, when a UV-$O_3$ treatment is performed on the surface of the insulating layer 111, a portion of the radical generating elements A may not be generated as the radical A. and may remain as a radical generation element A. In this case, the metal ion $M^{n+}$ and/or the oxidizer $M^{n+}$ may react with the radical generating element A to further generate a radical A. In an example embodiment in which the metal ion $M^{n+}$ is introduced, the above-mentioned reaction of generating the radical A. may be represented by Formula 1 below.

$$M^{n+} + A \leftarrow M^{(n-1)+} + A. \qquad \text{Formula 1:}$$
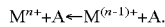

As a more detailed example, in addition to the oxygen radical O., a hydroxyl group —OH may be present on the surface of the insulating layer 111, and the metal ions $M^{n+}$ react with the hydroxyl group —OH to be converted into the oxygen radical O., and thus, the oxygen radical O. may be additionally generated. For example, the metal ions $M^{n+}$ may additionally generate the oxygen radical O. through a reaction represented by Formula 2 below.

$$M^{n+} + \text{—OH} \leftarrow M^{(n-1)+} + O. + H^+ \qquad \text{Formula 2:}$$
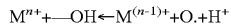

The metal ion $M^{n+}$ may be one or more of metal ions such as $Cu^{2+}$ copper ion (II), Ag+ silver ion (I), $Au^{3+}$ gold ion, $Co^{3+}$ cobalt ion (III), $Ce^{4+}$ cerium ion (IV), $Fe^{3+}$ iron ion (III), and $Sn^{4+}$ tin ion (IV) in which a positive standard reduction potential has a positive value.

The oxidizer may be, for example, oxygen ($O_2$), ozone ($O_3$), hydrogen peroxide ($H_2O_2$), nitric acid ($HNO_3$), manganese dioxide ($MnO_2$), or the like.

The metal ion and/or the oxidizer may be introduced in a manner of being added to a solution in which the insulating layer 111 is dipped, for example, a linker-containing solution. However, a manner of introducing the metal ion and/or the oxidizer is not limited thereto, and a process of introducing the metal ion and/or the oxidizer may be modified. For example, after the insulating layer 111 is dipped in a solution including the metal ion and/or the oxidizer to sufficiently generate radicals A., the insulating layer 111 may be dipped in another solution containing a linker.

As described above, the radicals A. may be uniformly generated on the surface of the insulating layer 111 through addition of the metal ions and/or the oxidizer, and thus, the linker may also be uniformly introduced and the bonding force to the metal may be further improved. On the other hand, when a metal material and/or an oxidizer is not added, a generation location of radicals A. generated on the surface of the insulating layer 111 may be relatively non-uniform and the amount of the generated radicals A. may be insufficient. Accordingly, there may be a limitation in improving the bonding force between the insulating film 110 and the metal layer 120.

At least a portion of the coordinate bond element B, included in the linker, may form a coordinating bond to at least a portion of the metal ions introduced to generate radicals A. Therefore, the surface bonding layer 111 may include metal elements. For example, even before a plating process is performed, the surface bonding layer 111 may include metal elements through a coordinate bond between the metal ions and the coordinate bond element B.

For example, when the meal ions are $Cu^{2+}$ copper ions (II), the surface bonding layer 111 may include copper (Cu).

As another example, the metal ions are one of Ag+ silver ions (I), $Au^{3+}$ gold ions, $Co^{3+}$ cobalt ions (III), $Ce^{4+}$ cerium ions (IV), $Fe^{3+}$ iron ions (III), and $Sn^{4+}$ tin ions (IV) as metal ions, the surface bonding layer 111 may include at least one of silver (Ag), gold (Au), cobalt (Co), cerium (Ce), iron (Fe) or tin (Sn).

In addition, as described above, the insulating layer 111 may include a metal foil such as copper foil, not illustrated, attached to the first surface 111-1. In this case, the metal foil attached to the first surface 111-1 of the insulating layer 111 may be ionized during a process to form a coordination bond to at least a portion of the coordinate bond element B included in the linker. In this case, even before the plating process is performed, the surface bonding layer 111 may also include metal elements through a coordinate bond of the metal ions and the coordinate bond element B. The process of ionizing the metal foil may be a process of generating the radicals A- and/or a process of introducing the linker.

For example, the insulating layer 111 may include a copper foil attached to the first surface 111-1, and copper included in the copper foil may form a coordinate bond to at least a portion of the coordinate bond element B.

In this case, when $Cu^{2+}$ copper ions (II) are used as the metal ions introduced to generate the radicals A., the surface bonding layer 111 may include both copper obtained from the metal ions and copper obtained from copper foil.

Meanwhile, when a material, other than $Cu^{2+}$ copper ions (II), is used as the metal ions introduced to form radicals A., the surface bonding layer 111 may include metal elements, other than copper obtained by the metal ions, and copper obtained from a copper foil. For example, the surface bonding layer 111 may include at least one of silver, gold, cobalt, cerium, iron, or tin obtained from metal ions and copper obtained from copper foil.

However, a metal foil attached to the first surface 111-1 of the insulating layer 111 is not limited to the copper foil. Therefore, type of metal elements, which may be included in the surface bonding layer 111, may vary depending on type of the metal foil.

When an atom content of the linker introduced to form the surface bonding layer 112 is significantly high, surface roughness of the surface bonding layer 112 of the insulating film 110 may be increased and a dielectric constant (Dk) and/or a dissipation factor (Df) may be increased by the linker to offset low dielectric characteristics. Meanwhile, when the atom content of the linker is not sufficiently high, the bonding force to the metal may not be sufficiently improved.

In this regard, a/b may 0.05 or more and 0.35 or less, in which 'a' is an atom content of a coordinate bond element B and 'b' is an atom content of the radical generation element A. In detail, a/b may be 0.05 or more and 0.25 or less. In further detail, a/b may be 0.05 or more and 0.15 or less. In this case, as described above, the coordinate bond element B may be nitrogen and the radical generating element A may be oxygen.

In a similar point of view, an atom content of the coordinate bond element B, included in the surface bonding layer 112 of the insulating film 110, may be 1 to 5% and, in further detail, 1 to 3.5%. For example, when the coordinate bond element B is nitrogen, an atom content of nitrogen may be 1 to 5%, in further detail, 1 to 3.5%. In addition, an atom content of the metal element may be 0.5 to 2%, in further detail, 0.5 to 1.5%. In addition, an atom content of the radical generation element A may be 15 to 20%, in further detail, 16 to 19%. For example, when the radical generation element A is oxygen, an atom content of oxygen may be 15 to 20%, in further detail, 16 to 19%. The surface bonding layer may further include an element such as carbon or the like.

When a ratio of the atom content 'a' of the coordinate bond element B to the atom content 'b' of the radical generating element A is out of the above range, the surface roughness of the surface bonding layer 112 may be increased or the bonding force to the metal may not be sufficiently improved. For example, when the atom content of the linker is significantly high, and thus, a/b is greater than 0.35, the dielectric constant Dk and/or dissipation factor (Df) may be increased by the linker and the low dielectric characteristics may be offset. When a/b is less than 0.05 and the atom content of the linker is not sufficient, the bonding force to the metal may not be sufficiently improved.

An atom content of each element in the surface bonding layer 112 may be measured using, for example, X-ray photoelectron spectroscopy (X-ray Photoelectron Spectroscopy: XPS) or the like, although the measurement should not be limited thereto.

The surface bonding layer 112 has surface roughness Ra of 50 to 300 nm, in further detail, 50 to 150 nm. For example, an insulating film, having improved bonding force to a metal layer without significantly increasing roughness, and a printed circuit board including the insulating film may be provided. Thus, radio-frequency signal loss, caused by an increase in the roughness of the insulating layer or the insulating film, may be significantly reduced.

Figure 4:
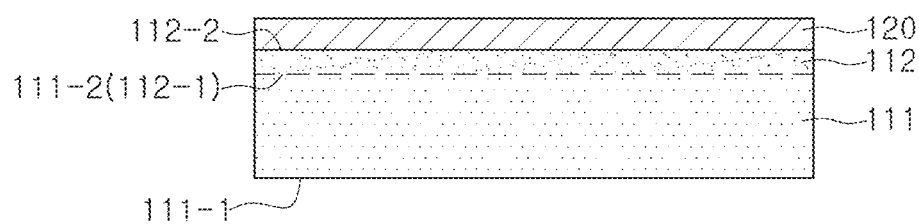
FIG. 4 is a cross-sectional view of a laminated plate on which a metal layer is attached to an insulating film.

FIG. 4 is a cross-sectional view of a laminated plate on which a metal layer is attached to an insulating film.

Figure 5:
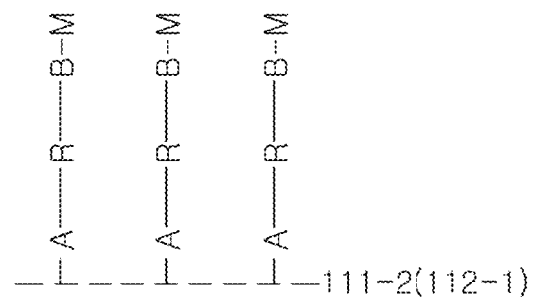
FIG. 5 is a schematic diagram illustrating a bonding structure between some elements on a surface of a laminated plate on which a metal layer is attached to an insulating film according to an example embodiment of the present disclosure.

FIG. 5 is a schematic diagram illustrating a bonding structure between some elements on a surface of a laminated plate on which a metal layer is attached to an insulating film according to an example embodiment.

Referring to FIG. 5, a metal layer 120 is formed on the second surface 112-2 of the surface bonding layer 112.

The metal layer 120 may be formed by a known plating process. For example, the metal layer 120 may be formed by performing electroplating after performing chemical plating on at least a portion of the surface bonding layer 112-2.

Referring to FIG. 5, at least a portion of the coordinate bond elements B, included in the linker, may form a coordinate bond with metal ions included in the plating solution during a plating process of forming a metal layer 120.

However, as described above, a portion of the metal elements, coordinately bonded to the coordinate bond element B, may be formed by a solution including metal ions, dipping the insulating layer 111, or a metal foil such as a copper foil. In this case, the metal element is present on the surface of the insulating film 111 to allow the metal ions, included in the plating solution, to be easily attached to the metal element serving as a film.

According to this application, the first surface 112-1 of the surface bonding layer 112 may serve to bond the surface bonding layer 112 to the insulating layer 111, and the second surface 112-2 of the surface bonding layer 112 may serve to bond the surface bonding layer 112 to the metal layer 120. For this reason, bonding force between the insulating film 110 and the metal layer 120 may be improved. For example, the radical generating element A and the linker may form a covalent bond on the first surface 112-1 of the surface bonding layer 112, and the coordinate bond element B of the linker and the metal element may form a coordinate bond on the second surface 112-2 of the surface bonding layer 112.

After the metal layer 120 is formed, a heat treatment process may be further performed, as necessary.

A process such as patterning, or the like, may be additionally performed on the metal layer 120 to form a wiring pattern, and thus, a printed circuit board may be formed.

The wiring pattern may be formed by a known method. For example, the wiring pattern may be formed using an additive process, a semi-additive process, or a tenting process.

Hereinafter, inventive examples will be described in detail with comparative examples. However, the following description is given to help in gaining an understanding of this application, and this application is not limited to the inventive examples.

Comparative Example 1

A metal layer was formed by performing chemical plating and electroplating without performing an additional surface treatment on an insulating layer including a liquid crystal polymer.

In the chemical plating of Comparative Example 1, an insulating layer was not plated or a blister is formed, and peel strength was unmeasurable.

Comparative Example 2

A UV-$O_3$ treatment was performed on a surface of an insulating layer including a liquid crystal polymer. Chemical plating and electroplating were sequentially performed on the surface of the insulating layer, subjected to the UV-$O_3$ treatment, to thicknesses of 0.5 μm and 20 μm, respectively. A heat treatment was performed at temperature of 290° C. for 15 minutes, and then the bonding force between the insulating layer and the metal layer was measured.

Comparative Example 3

A UV-$O_3$ treatment was performed on a surface of an insulating layer including a liquid crystal polymer. The insulating layer was dipped in a solution, containing 4 ml/L of allylamine, for two hours. Chemical plating and electroplating were sequentially performed on the surface of the dipped insulating layer to thicknesses of 0.5 μm and 20 μm, respectively. A heat treatment was performed at temperature of 290° C. for 15 minutes, and then bonding force between the insulating layer and a metal layer was measured.

An atom content of nitrogen, contained in the surface bonding layer formed by Comparative Example 3, was 0.64%, an atom content of oxygen was 20.74%, and a ratio of 'a' to 'b' (a/b) was about 0.03 in which 'a' is the atom content of nitrogen and 'b' is the atom content of oxygen.

Comparative Example 4

A UV-$O_3$ treatment was performed on a surface of an insulating layer including a liquid crystal polymer. The insulating layer was dipped in a solution, containing 16 ml/L concentration of allylamine and 7.5 ppm concentration of $Cu^{2+}$ copper ions (II), for an hour. Chemical plating and electroplating were sequentially performed on the surface of the dipped insulating layer to thicknesses of 0.5 μm and 20 μm, respectively. A heat treatment was performed at temperature of 290° C. for 15 minutes, and then bonding force between the insulating layer and a metal layer was measured.

An atom content of nitrogen, contained in the surface bonding layer formed by Comparative Example 4, was 5.94%, an atom content of oxygen was 15.76%, and a ratio of 'a' to 'b' (a/b) was about 0.38 in which 'a' is the atom content of nitrogen and 'b' is the atom content of oxygen.

Inventive Example 1

A $UV-O_3$ treatment was performed on a surface of an insulating layer including a liquid crystal polymer. The insulating layer was dipped in a solution, containing 4 ml/L concentration of allylamine and 7.5 ppm concentration of $Cu^{2+}$ copper ions (II), for an hour. Chemical plating and electroplating were sequentially performed on the surface of the dipped insulating layer to thicknesses of 0.5 μm and 20 μm, respectively. A heat treatment was performed at temperature of 290° C. for 15 minutes, and then bonding force between the insulating layer and a metal layer was measured.

An atom content of nitrogen, contained in the surface bonding layer formed by Inventive Example 1, was 1.48%, an atom content of oxygen was 17.04%, and a ratio of 'a' to 'b' (a/b) was about 0.09 in which 'a' is the atom content of nitrogen and 'b' is the atom content of oxygen.

Inventive Example 2

An insulating layer was dipped in a solution for two hours. The other conditions were the same as those in Inventive Example 1.

An atom content of nitrogen, contained in the surface bonding layer formed by Inventive Example 2, was 1.62%, an atom content of oxygen was 16.67%, and a ratio of 'a' to 'b' (a/b) was about 0.10 in which 'a' is the atom content of nitrogen and 'b' is the atom content of oxygen.

Inventive Example 3

Instead of 7.5 ppm concentration of $Cu^{2+}$ copper ions (II), 7 ppm concentration of $Ce^{4+}$ cerium ions (IV) were added to a solution, dipping an insulating layer, and the insulating layer was dipped in the solution for an hour. The other conditions were the same as Inventive Example 1.

An atom content of nitrogen, contained in the surface bonding layer formed by Inventive Example 3, was 1.46%, an atom content of oxygen was 15.40%, and a ratio of 'a' to 'b' (a/b) was about 0.09 in which 'a' is the atom content of nitrogen and 'b' is the atom content of oxygen.

Inventive Example 4

An insulating layer was dipped in a solution for two hours. The other conditions are the same as those of Inventive Example 3.

An atom content of nitrogen, contained in the surface bonding layer formed by Inventive Example 4, was 1.53%, an atom content of oxygen was 15.00%, and a ratio of 'a' to 'b' (a/b) was about 0.10 in which 'a' is the atom content of nitrogen and 'b' is the atom content of oxygen.

Inventive Example 5

A $UV-O_3$ treatment was performed on a surface of an insulating layer including a liquid crystal polymer. The insulating layer was dipped in a solution, containing 4 ml/L of vinyl imidazole and 7.5 ppm concentration of $Cu^{2+}$ copper ions (II). Chemical plating and electroplating were sequentially performed on the surface of the dipped insulating layer to thicknesses of 0.5 μm and 20 μm, respectively. A heat treatment was performed at temperature of 290° C. for 15 minutes, and then bonding force between the insulating layer and a metal layer was measured.

That is, in Inventive Example 5, instead of allylamine used in Inventive Example 1, vinylimidazole was used as a linker. The other conditions were the same as those in Inventive Example 1.

An atom content of nitrogen, contained in the surface bonding layer formed by Inventive Example 5, was 1.87%, an atom content of oxygen was 17.88%, and a ratio of 'a' to 'b' (a/b) was about 0.10 in which 'a' is the atom content of nitrogen and 'b' is the atom content of oxygen.

Inventive Example 6

An insulating layer was dipped in a solution for two hours. The other conditions were the same as those in Inventive Example 5.

An atom content of nitrogen, contained in the surface bonding layer formed by Inventive Example 6, was 1.64%, an atom content of oxygen was 16.84%, and a ratio of 'a' to 'b' (a/b) was about 0.10 in which 'a' is the atom content of nitrogen and 'b' is the atom content of oxygen.

Inventive Example 7

Instead of 7.5 ppm concentration of $Cu^{2+}$ copper ions (II) used in Inventive Example 5, 7 ppm concentration of $Ce^{4+}$ cerium ions (IV) were added to a solution for dipping an insulating layer. The other conditions were the same as Inventive Example 5.

An atom content of nitrogen, contained in the surface bonding layer formed by Inventive Example 7, was 1.78%, an atom content of oxygen was 16.24%, and a ratio of 'a' to 'b' (a/b) was about 0.11 in which 'a' is the atom content of nitrogen and 'b' is the atom content of oxygen.

Inventive Example 8

An insulating layer was dipped in a solution for two hours. The other conditions were the same as those in Inventive Example 7.

An atom content of nitrogen, contained in the surface bonding layer formed by Inventive Example 8, was 1.89%, an atom content of oxygen was 16.35%, and a ratio of 'a' to 'b' (a/b) was about 0.12 in which 'a' is the atom content of nitrogen and 'b' is the atom content of oxygen.

TABLE 1

| | Surface Treatment | Type of Binding Material | Concentration of Binding Material (ml/L) | Type of Metal Ion | Concentration of Metal Ion (ppm) | Dipping Time (hr) | Chemical Plating Thickness (μm)/Electroplating Thickness (μm) |
|---|---|---|---|---|---|---|---|
| Comparative Example 1 | Untreated | — | — | — | — | — | — |
| Comparative Example 2 | UV-O3 | — | — | — | — | — | 0.5/2.0 |
| Comparative Example 3 | UV-O3 | — | — | — | — | 2 | 0.5/2.0 |
| Comparative Example 4 | UV-O3 | Allylamine | 16 | Cu2+ | 7.5 | 1 | 0.5/2.0 |
| Inventive Example 1 | UV-O3 | Allylamine | 4 | Cu2+ | 7.5 | 1 | 0.5/2.0 |
| Inventive Example 2 | UV-O3 | Allylamine | 4 | Cu2+ | 7.5 | 2 | 0.5/2.0 |
| Inventive Example 3 | UV-O3 | Allylamine | 4 | Ce4+ | 7 | 1 | 0.5/2.0 |
| Inventive Example 4 | UV-O3 | Allylamine | 4 | Ce4+ | 7 | 2 | 0.5/2.0 |
| Inventive Example 5 | UV-O3 | Vinylimidazole | 4 | Cu2+ | 7.5 | 1 | 0.5/2.0 |
| Inventive Example 6 | UV-O3 | Vinylimidazole | 4 | Cu2+ | 7.5 | 2 | 0.5/2.0 |
| Inventive Example 7 | UV-O3 | Vinylimidazole | 4 | Ce4+ | 7 | 1 | 0.5/2.0 |
| Inventive Example 8 | UV-O3 | Vinylimidazole | 4 | Ce4+ | 7 | 2 | 0.5/2.0 |

| | Temperature and Time of Heat Treatment (° C., min) | Concentration of Nitrogen (%) | Concentration of Oxygen (%) | a/b | Peel Strength Primary/Secondary (N/mm) | Low Dielectric Characteristics |
|---|---|---|---|---|---|---|
| Comparative Example 1 | — | — | — | — | Unmeasurable | ○ |
| Comparative Example 2 | 290° C., 15 min | 0 | 25.54 | 0 | 0.41/0.19 | ○ |
| Comparative Example 3 | 290° C., 15 min | 0.64 | 20.74 | 0.03 | 0.34/0.48 | ○ |
| Comparative Example 4 | 290° C., 15 min | 5.94 | 15.76 | 0.38 | — | ○ |
| Inventive Example 1 | 290° C., 15 min | 1.48 | 17.04 | 0.09 | 0.64/0.71 | ○ |
| Inventive Example 2 | 290° C., 15 min | 1.62 | 16.67 | 0.10 | 0.73/0.62 | ○ |
| Inventive Example 3 | 290° C., 15 min | 1.46 | 15.4 | 0.09 | 0.61/0.63 | ○ |
| Inventive Example 4 | 290° C., 15 min | 1.53 | 15 | 0.10 | 0.64/0.67 | ○ |
| Inventive Example 5 | 290° C., 15 min | 1.87 | 17.88 | 0.10 | 0.67/0.71 | ○ |
| Inventive Example 6 | 290° C., 15 min | 1.64 | 16.84 | 0.10 | 0.73/0.72 | ○ |
| Inventive Example 7 | 290° C., 15 min | 1.78 | 16.24 | 0.11 | 0.61/0.63 | ○ |

TABLE 1-continued

| | | | | | | |
|---|---|---|---|---|---|---|
| Inventive Example 8 | 290° C., 15 min | 1.89 | 16.35 | 0.12 | 0.75/0.72 | ○ |

Peel strength was measured using a universal testing (5943 UTM, Instron), and was measured by peeling a specimen of 10 mm*30 mm in a 90° peel mode.

In addition, a low dielectric characteristic was measured by loss of a radio-frequency signal at 10 GHz. When a measured value is −60 dB/m or less, the low dielectric characteristic was represented by O. When the measured value was greater than −60 dB/m, the low dielectric characteristic was represented by X.

According to the results, in Comparative Example 1, a plating process was directly performed on the surface of the insulating layer including a liquid crystal polymer. Due to low bonding force to the metal, a surface-untreated liquid crystal polymer was not plated or a blister was formed.

In Comparative Example 2, the UV-$O_3$ treatment was performed on the surface of the insulating layer including a liquid crystal polymer. Peel strength with the metal layer of Comparative Example 2 was improved as compared with that of Comparative Example 1. However, sufficient bonding force with the metal layer was not still secured. In addition, a peel strength measurement deviation was significantly high.

Figure 6:
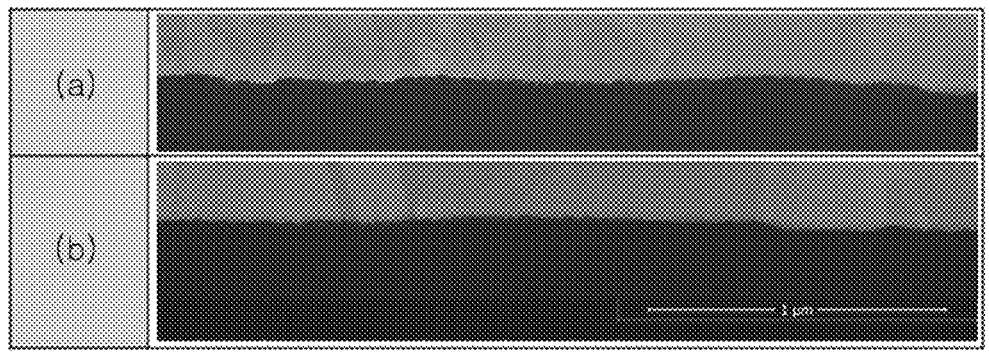
FIG. 6 is a cross-sectional image on a boundary between an insulating film and a metal layer of a laminated plate on which the metal layer is attached to the insulating film according to an example embodiment of the present disclosure.

Referring to FIG. 6, in the case of an image (a) in which only a UV-$O_3$ treatment was performed on a surface of an insulating layer surface similarly to Comparative Example 2, the surface of the insulating layer is not smooth and fine voids are observed between the insulating layer and the metal layer. On the other hand, in the case of an image (b) in which a UV—$O_3$ treatment was performed on the surface of the insulating layer surface and a linker was introduced according to example embodiments, a surface of an insulating film was smooth and the insulating film and the metal layer were uniformly bonded to each other without voids.

In Comparative Example 3, the insulating layer was dipped in a solution to which only a linker was added and metal ions were not added. In Inventive Examples 1 to 8, an insulating layer was dipped in a solution to which both a linker and metal ions were added. In Comparative Example 3, a peel strength average was improved as compared to Comparative Example 1 but did not reach a peel strength value of Inventive Examples 1 to 8. For example, in the case of Comparative Example 3, an atom content of nitrogen, a coordinate bond element, was not sufficiently high because metal ions were not added, and bonding force to the metal layer was not sufficiently secured.

In Comparative Example 4, 16 ml/L concentration of a linker (allylamine) was used and low dielectric characteristics were not secured. For example, when the atom content of the linker is significantly high, and thus, a/b is greater than 0.35, excessive signal loss may occur in a radio-frequency region. Therefore, to secure both peel strength and low dielectric characteristics, a/b needs to be adjusted to be 0.35 or less.

Meanwhile, in Inventive Examples 1 to 8, sufficient radicals A. were formed on the surface of the insulating layer 111 through introduction of metal ions to have a sufficiently high concentration of nitrogen, a coordinate bond element. Thus, the bonding force to the metal layer may be further improved. In addition, the atom content of the linker may be appropriately adjusted to prevent signal loss even in a radio-frequency region and improved low dielectric characteristics may be secured. For example, the signal loss in the radio-frequency region may be significantly reduced while improving the bonding strength of the insulating layer to the metal layer.

Figure 7:
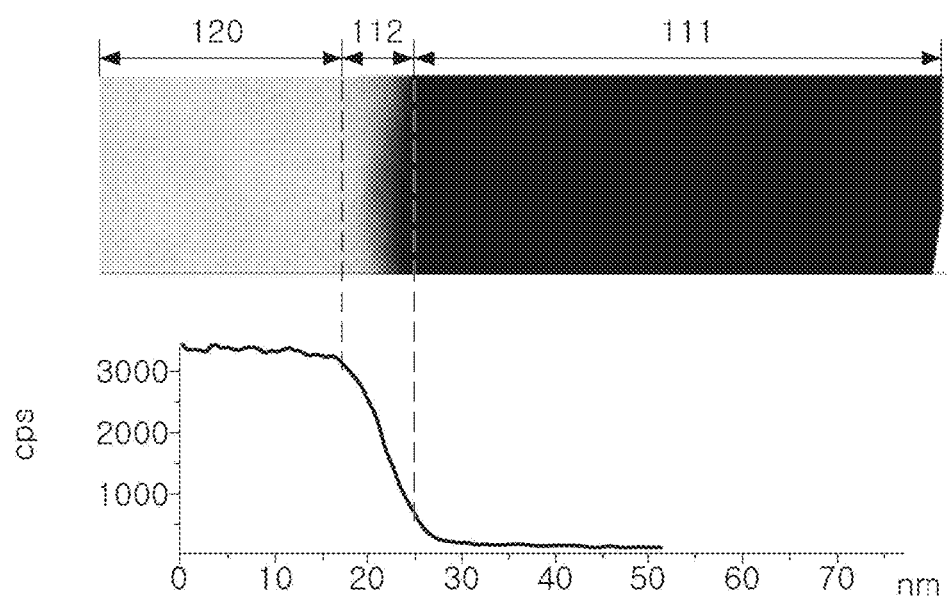
FIG. 7 illustrates a cross-sectional image of a laminated plate, on which a metal layer is attached to an insulating film according to an example embodiment, and an atom content of copper.

FIG. 7 illustrates a cross-sectional image of a laminated plate, on which a metal layer is attached to an insulating film according to an example embodiment, and an atom content of copper.

A UV-O3 treatment was performed on a surface of an insulating layer 111 to generate oxygen radicals O., oxygen radicals O. were additionally generated using $Cu^{2+}$ copper ions (II) as metal ions, and a surface bonding layer 112 was formed using allylamine as a linker. Accordingly, radical generating element A, included in the surface bonding layer 112, includes oxygen, and a coordinate bond element B includes nitrogen, and a metal element includes copper. Then, a copper plating process was performed to form a metal layer 120. Thus, the metal layer 120 may be a copper layer.

In FIG. 7, the cross-sectional image shows a cross section of a laminated plate, including the plating layer 120, the surface bonding layer 111, and the insulating layer 110, measured using transmission electron microscopy (TEM). In FIG. 7, a graph shows a distribution of copper elements in the plating layer 120 in a thickness direction of the insulating layer 111.

As can be seen in FIG. 7, the surface bonding layer 111 includes copper. The copper, included in the surface bonding layer 111, may be obtained from $Cu^{2+}$ copper ions (II) introduced to generate oxygen radicals O.. In addition, the metal layer 120 may be obtained from copper ions included in a plating solution for forming the metal layer 120. For example, copper ions may be coordinately bonded to nitrogen of a coordinate bond element B, so that the surface bonding layer 111 includes copper.

In addition, an atom content of a copper element may be reduced in a direction toward the surface bonding layer 111 from the surface bonding layer 111. A reduction rate of the copper element in the surface bonding layer 111 is less than a reduction rate of the copper element in the plating layer 120.

As described above, an insulating film, having improved bonding force to a metal layer and capable of significantly reducing radio-frequency signal loss without significantly increasing surface roughness, and a printed circuit board including the insulating film may be provided.

While example embodiments have been shown and described above, it will be apparent to those skilled in the art that modifications and variations could be made without departing from the scope of the present disclosure as defined by the appended claims.

What is claimed is:
1. An insulating film comprising:
an insulating layer; and
a surface bonding layer disposed on the insulating layer, wherein the surface bonding layer includes a radical generation element and a coordinate bond element, and in the surface bonding layer, a/b is 0.05 or more and 0.35 or less, in which 'a' is an atom content of the coordinate bond element and 'b' is an atom content of the radical generation element.

2. The insulating film of claim 1, wherein the insulating layer includes a liquid crystal polymer.

3. The insulating film of claim 1, wherein the surface bonding layer further includes a metal element.

4. The insulating film of claim 1, wherein the radical generation element includes oxygen, and the coordinate bond element includes nitrogen.

5. The insulating film of claim 1, wherein surface roughness of the surface bonding layer is 50 nm or more and 300 nm or less.

6. The insulating film of claim 4, wherein an atom content of the nitrogen in the surface bonding layer is 1% or more and 5% or less, and an atom content of the oxygen in the surface bonding layer 15% or more and 20% or less.

7. The insulating film of claim 4, wherein an atom content of the nitrogen in the surface bonding layer is 1% or more and 3.5% or less, and an atom content of the oxygen in the surface bonding layer 16% or more and 19% or less.

8. A printed circuit board comprising:
an insulating film including an insulating layer and a surface bonding layer disposed on the insulating layer; and
a metal layer disposed on the surface bonding layer,
wherein the surface bonding layer includes a radical generation element and a coordinate bond element, and
in the surface bonding layer, a/b is 0.05 or more and 0.35 or less, in which 'a' is an atom content of the coordinate bond element and 'b' is an atom content of the radical generation element.

9. The printed circuit board of claim 8, wherein the insulating layer includes a liquid crystal polymer.

10. The printed circuit board of claim 8, wherein the radical generation element includes oxygen, and the coordinate bond element includes nitrogen.

11. The printed circuit board of claim 10, wherein an atom content of the nitrogen in the surface bonding layer is 1% or more and 5% or less.

12. The printed circuit board of claim 10, wherein the surface bonding layer further includes sulfur.

13. The printed circuit board of claim 10, wherein an atom content of the nitrogen in the surface bonding layer is 1% or more and 3.5% or less.

14. The printed circuit board of claim 10, wherein an atom content of the oxygen in the surface bonding layer 15% or more and 20% or less.

15. The printed circuit board of claim 10, wherein an atom content of the oxygen in the surface bonding layer 16% or more and 19% or less.

16. The printed circuit board of claim 8, wherein the surface bonding layer further includes a metal element.

17. The printed circuit board of claim 16, wherein the metal element includes copper.

18. The printed circuit board of claim 17, wherein the metal element further includes at least one of silver, gold, cobalt, cerium, iron, or tin.

19. The printed circuit board of claim 16, wherein the metal element includes at least one of silver, gold, cobalt, cerium, iron, or tin.

* * * * *